United States Patent [19]
Benwood et al.

[11] 3,944,354
[45] Mar. 16, 1976

[54] VOLTAGE MEASUREMENT APPARATUS

[75] Inventors: Bruce R. Benwood, Spencerport; Howard D. Siebenrock, Rochester, both of N.Y.

[73] Assignee: Eastman Kodak Company, Rochester, N.Y.

[22] Filed: Sept. 6, 1974

[21] Appl. No.: 503,996

[52] U.S. Cl. .................... 355/3 R; 324/32; 324/72; 355/14; 355/16
[51] Int. Cl.² .......................................... G03G 15/00
[58] Field of Search .......... 355/3 R, 14, 16; 324/72, 324/72.5, 32

[56] References Cited
UNITED STATES PATENTS

| | | | |
|---|---|---|---|
| 3,370,225 | 2/1968 | Winder | 324/32 |
| 3,406,334 | 10/1968 | Marquart et al. | 324/32 |
| 3,544,889 | 12/1970 | Alauzet et al. | 324/32 |
| 3,729,675 | 4/1973 | Vosteen | 324/32 X |
| 3,852,668 | 12/1974 | Hardenbrook et al. | 324/32 X |

*Primary Examiner*—R. L. Moses
*Attorney, Agent, or Firm*—D. I. Hague

[57] ABSTRACT

Apparatus for measuring the surface potential of moving electrostatically charged elements uses at least one electrically conducting detector mounted on the outer periphery of a grounded roller. An insulated ring secured around each end of the roller in an edge contacting relationship with the charged element under measurement provides a friction drive for the roller and maintains the detector in a spaced and non-contacting position from the charged element. As the roller is rotated, the detector is alternately exposed to the charged element and to a grounded shell arranged in a spaced and non-contacting manner from both the charged element and the roller and builds an A.C. voltage on a sampling capacitor. The output of the sampling capacitor is connected to a circuit which determines the envelope of the A.C. voltage and provides a differential D.C. voltage representative of the surface potential of the charged element. This D.C. voltage can be used as a control signal in an electrophotographic copying machine to control the charging, exposing, developing and/or cleaning operations of the machine.

6 Claims, 6 Drawing Figures

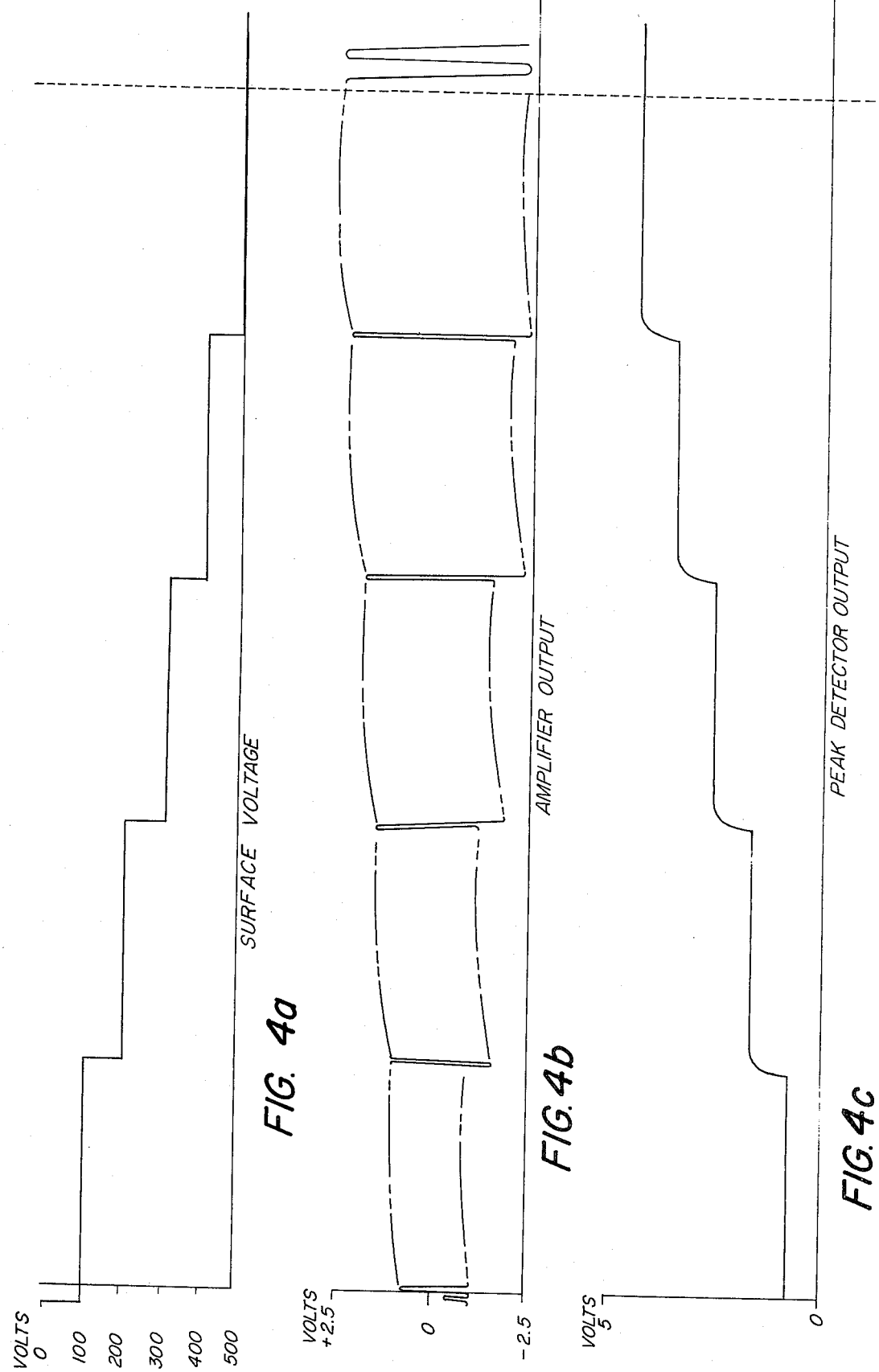

VOLTAGE MEASUREMENT APPARATUS

BACKGROUND OF THE INVENTION

1. Field of the Invention

This invention relates to an apparatus for measuring the surface potential of electrostatically charged elements.

2. Description of the Prior Art

It is known in the art that the surface potential of an electrostatically charged element can be measured by placing a conducting probe at a fixed distance from the element and connecting the probe, with a capacitor to ground. Under these circumstances the relationship between the voltage at the surface under measurement ($V_s$), the voltage at the probe ($V_p$) and the voltage at the capacitor ($V_c$), is $$V_p = V_c = V_s \left[ \frac{\frac{1}{C \text{ capacitor}}}{\frac{1}{C \text{ probe}} + \frac{1}{C \text{ capacitor}}} \right]$$

where C probe << C photoconductor.

By measuring the voltage on the capacitor ($V_c$) with a conventional electrometer, the voltage on the charged surface ($V_s$) can be determined. One practical limitation of the above-described measuring apparatus is that the resistance (R) of the electrometer will discharge the capacitor (C) so that the time constant (T=RC) must be long enough to provide desired accuracy with reasonable reading times. For example, if the desired accuracy is 1 percent and a time of 1 second is sufficient to read the meter, the time constant (T) must be 100 seconds. This normally dictates extremely large values for the resistor (R). Of course, the time constant (T) can also be increased by increasing the capacitor (C), but this is at the expense of $V_p$.

One known technique to reduce the time constant required for accurate reading of the electrometer is to periodically chop the signal on the probe. By alternately exposing the probe to the electric field of the surface under measurement and grounding the probe, an AC voltage is built up on the capacitor which can be peak detected to provide a DC voltage representative of the voltage on the charged surface. The shorter time constant required allows the use of capacitance and impedance values that can be obtained through the use of conventional components. A voltage measuring apparatus using the above-described signal chopping technique is disclosed in U.S. Pat. No. 3,729,675 to Vosteen issued Apr. 24, 1973. To provide the periodic grounding of the probe, the Vosteen apparatus includes a grounded band attached to the surface to be measured. One disadvantage of this arrangement is that the placement of a grounded band on the surface of a charged element in situ in a machine is frequently a difficult operation. To overcome this difficulty, the element can be removed from the machine for measurement on a separate apparatus or, alternatively, the grounded band can be included in the manufacture of the element itself. The first alternative is time consuming and, more importantly, eliminates environmental changes in the machine which affect charging of the element. The second alternative increases the cost and complexity of the element. Furthermore, a charged element with an integral grounded band cannot be used in certain applications. For example, in electrophotographic copying machines, a grounded band attached to the photoconductive imaging surface would (1) adversely affect the triboelectric relationship of the developer mixture; (2) attract the receiver sheet used in transfer electrophotography so that the sheet will not separate from the photoconductive surface; and (3) short circuit an electrically biased development electrode as the grounded band moved past such electrode. For these and other reasons, the development of a voltage measurement apparatus capable of in situ operation in a machine continues to be a problem in the art.

SUMMARY OF THE INVENTION

It is, therefore, an object of the invention to provide a voltage measurement apparatus which can be installed in a machine and used in situ.

Another object of the invention is to provide a voltage measurement apparatus for in situ machine use which is compact, inexpensive to manufacture and yet thoroughly efficient and reliable in operation.

These and other objects of the invention are accomplished by providing a rotatable probe having at least one electrically conducting detector arranged in a spaced and non-contacting manner from the charged surface. As the probe is rotated, the detector is alternately exposed to the charged surface under measurement and to a grounding member arranged in a spaced and non-contacting manner from both the charged surface and the probe and builds an AC voltage on a sampling capacitor. The AC voltage on the sampling capacitor is then peak detected to provide a DC voltage representative of the voltage on the charged surface.

In accordance with a preferred embodiment of the invention, the voltage measurement apparatus comprises a grounded roller with six electrometer probes positioned at equally spaced intervals about the outer periphery of the roller. Three probes are located at each end of the roller to allow side-to-side readings of a moving, electrostatically charged film. An insulated ring is secured around each end of the roller in a contacting relationship with the charged film so as to provide a friction drive for the roller. The two rings also maintain a fixed distance between the probes and the charged film. Grounding of the probes is accomplished by surrounding the roller with a grounded shell having a slit therein dimensioned to expose only two probes at a time to the charged film. The probes are connected to a circuit including a sampling capacitor, an amplifier and a peak-to-peak detector whose output signal is representative of the voltage on the film.

The apparatus of the invention provides accurate voltage measurements by minimizing the problems of distance sensitivity and amplifier drift associated with many electrometers. The high accuracy and in situ capability of the voltage measurement apparatus permits precise charging control of dielectric elements, a feature of critical importance in high volume electrophotographic copy machines.

The invention and its objects and advantages can be best understood from the ensuing description of the preferred embodiment, reference being made to the accompanying drawings wherein like reference numerals denote like parts.

BRIEF DESCRIPTION OF THE DRAWINGS

FIGS. 4A, 4B and 4C are graphs showing the voltage applied to the surface under measurement and the voltage outputs of two components of the circuit of FIG. 3.

DETAILED DESCRIPTION OF THE PREFERRED EMBODIMENT

In the detailed description of the preferred embodiment which follows, the invention is described in connection with an electrophotographic film used in an electrophotographic copying machine. It is to be understood, however, that the apparatus of the present invention could be used with equal facility and advantage to measure the surface potential of other electrostatically charged elements and, therefore, that the following description of apparatus related to but not forming part of the invention is provided for illustrative purposes only.

Figure 1:
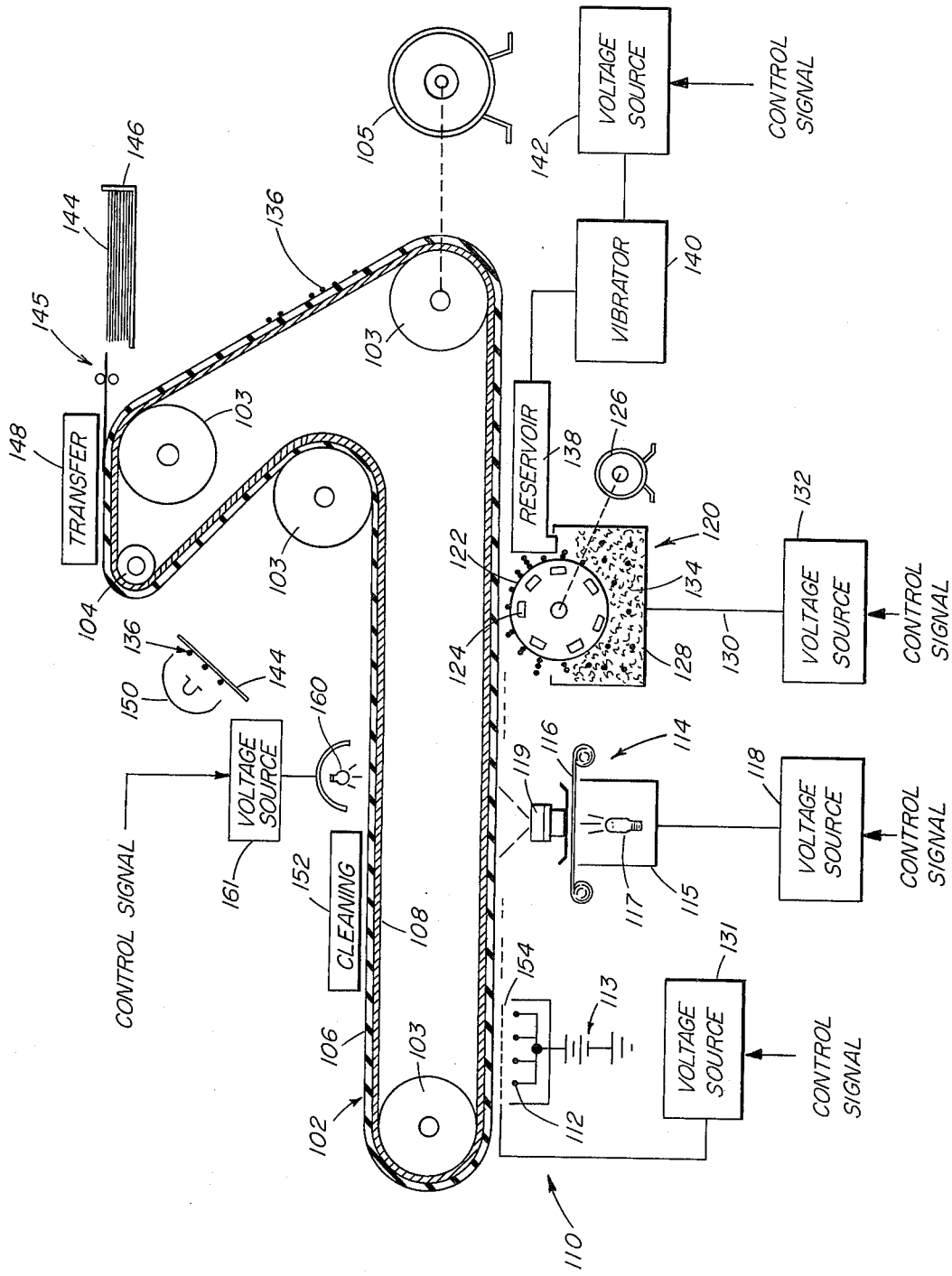
FIG. 1 is a schematic diagram illustrating an electrophotographic copying apparatus in which the present invention is particularly useful.

Referring now to FIG. 1, a typical electrophotographic copying machine wherein the invention has particular utility is shown to comprise an endless electrophotographic recording element 102 which is driven about rollers 103 and 104 along a predetermined endless path by a motor 105, the latter being coupled with one of the rollers by means (not shown). The endless recording element 102 generally comprises a photoconductive coating 106 which is provided with an electrically grounded conductive backing 108. Disposed along the path are the various electrophotographic stations which serve to form a toner image of the document being copied upon the outer photoconductive surface 106 of the recording element 102. The recording element first passes a station 110 having apparatus for producing a uniform electrostatic charge upon the photoconductive coating 106. A suitable apparatus is a corona apparatus comprising a plurality of wires 112 spaced from the photoconductive coating 106 and connected to a voltage source 113. When a sufficiently high voltage is applied to the wires 112, a corona discharge issues therefrom and deposits charge particles (shown for the purposes of illustration as negative charges) upon the photoconductive coating 106. Upon being uniformly charged, the charge bearing recording element 102 is advanced past an exposure station 114 where it is imagewise exposed to actinic radiation in accordance with the light and dark areas of the original document. The imagewise exposure serves to selectively dissipate the uniform charge on the photoconductive coating 106 to form an electrostatic latent image corresponding to the indicia on the original document. Such imagewise exposure can be accomplished by projecting a light image from a projector 115 having a photographic transparency 116 in the aperture thereof, a projector bulb or other source of illumination 117 connected to a voltage source 118 and a lens system 119. Development of the electrostatic latent image is accomplished as that portion of the recording element 102 bearing such image passes a development station 120 where it is subjected to an electrophotographic developer. For this purpose there is provided a magnetic brush unit including a rotatable aluminum sleeve 122 surrounding position adjustable magnets 124 and a motor 126 for rotation of the sleeve. The brush is mounted in a housing 128 electrically insulated from ground and is provided with a bias wire 130 through which an electrical bias voltage from a voltage source 132 can be delivered to the brush. As the brush rotates, it carries with it in bristle formation on the outer periphery of the sleeve 122 a quantity of a developer mixture 134 comprising electroscopic toner particles and magnetic carrier particles. During the development process the toner particles are separated from the triboelectrically attracted carrier particles by the stronger forces associated with the electrostatic image and are deposited on the photoconductive coating 106 to form a toner image 136. To replenish the developer mixture 134 there is also provided a reservoir 138 for holding toner particles. The toner particles are fed from the reservoir 138 into the brush housing 128 by vibrating the reservoir 138 with a mechanically connected vibrator 140 operated by a voltage source 142. To reuse that portion of the recording element 102 bearing the toner image 136 the toner image is transferred to a paper receiving sheet 144 on which the toner particles can be permanently fused. Such transfer is commonly effected by a paper feeding device 145 which feeds sheets of paper from a paper supply 146 to a transfer station 148 simultaneously with the passage therepast of the toner image bearing recording element 102. Transfer station 148 commonly comprises means for electrostatically charging the paper receiver sheet 144 to a potential of opposite polarity to the charge on the toner particles so as to attract the toner particles from the surface of the recording element 102 to the receiver sheet 144.

After the toner image 136 is transferred to the paper receiving sheet 144, the sheet 144 is peeled away from the recording element 102 as the latter passes over small roller 104. The receiver sheet 144 is then fed to a fusing station 150 which heat fuses the toner particles to the sheet. After image transfer, the recording element 102 is advanced past an erase lamp 160 operated by a voltage source 161 which directs a flooding light onto the photoconductive coating 106 of the recording element 102. The flooding light reduces the charge in the untoned areas of the photoconductive coating 106 and thereby decreases the attraction between the photoconductive coating 106 and the residual toner particles which remain on the recording element 102 after transfer. Finally, the recording element 102 is advanced past a cleaning station 152 which readies the element 102 for recycling by removing any residual toner particles which remain on the photoconductive coating 106.

As the photoconductive member moves repeatedly through the above-described cycle, its charging capability changes. Principal causes of this change are photoconductor fatigue and varying ambient temperature and humidity conditions. To produce copies of uniform high quality, it is, therefore, necessary to have precise control of the chargeing of the photoconductor member.

Referring now to FIG. 4, there is shown an apparatus 10 for measuring the amplitude of an electrostatic charge borne on a photoconductive film or web 102 driven (by means not shown) around a roller 18 in the direction indicated by arrow A. The apparatus 10 includes a roller 14 maintained at earth or ground potential. Installed about the outer periphery of the roller 14 are six electrically conducting probes 16. Advantageously, the six probes form three probe pairs, 16a and 16b; 16c and 16d; and 16e and 16f, respectively, positioned at equally spaced intervals around the circumference of the roller 14. The use of probe pairs allows side-to-side voltage readings of the charged photoconductive film 102 so that voltage gradients across the width of the film can be detected. It is to be understood, however, that the probe pairs could be replaced with a single probe if the side-to-side voltage reading capability is not desired. Furthermore, the number of probes or probe pairs can also be varied depending upon the size of the roller and the degree of charging control desired.

Figure 2:
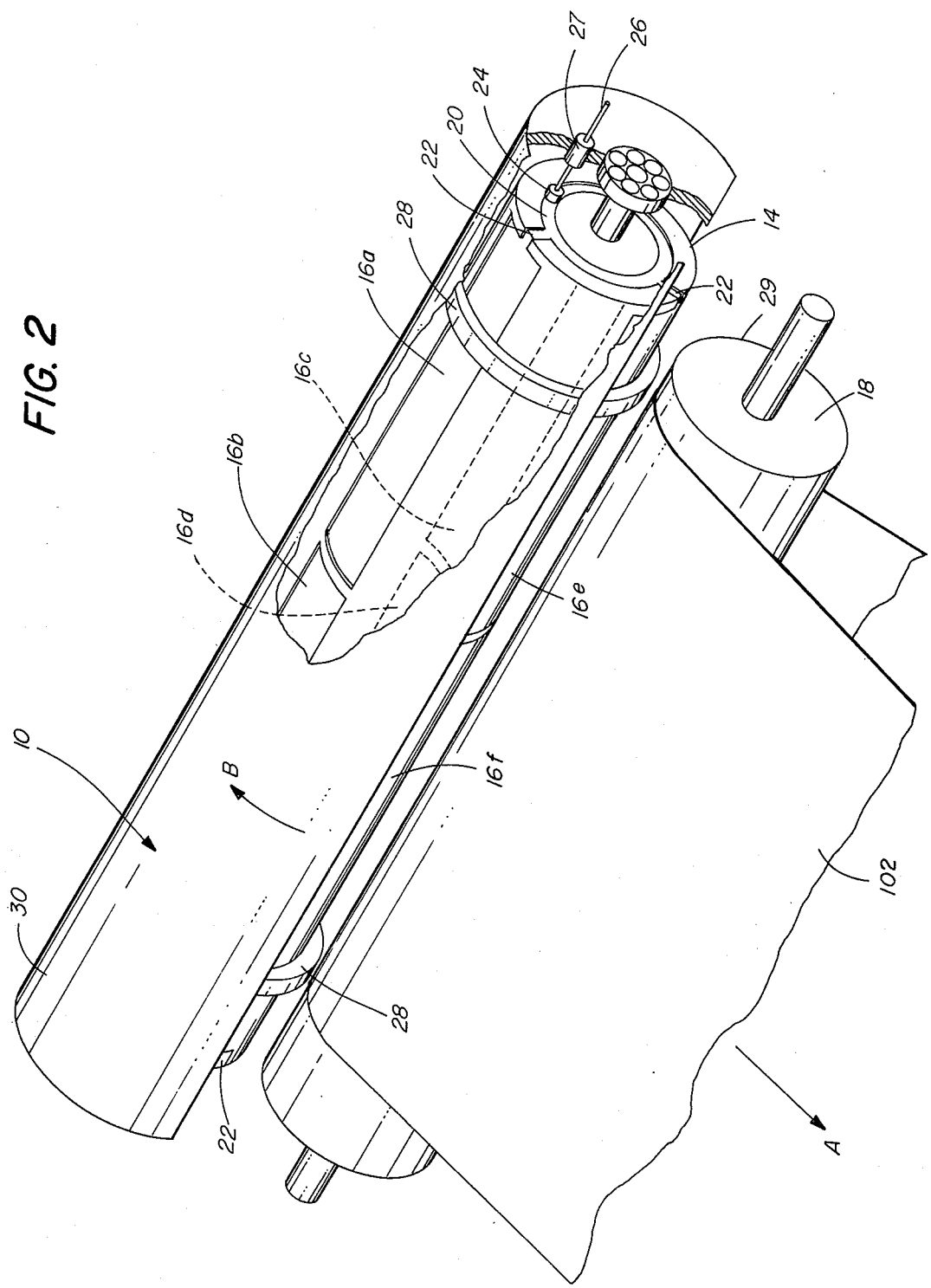
FIG. 2 is a perspective view of a voltage measurement apparatus constructed in accordance with a preferred embodiment of the invention.
Figure 3:
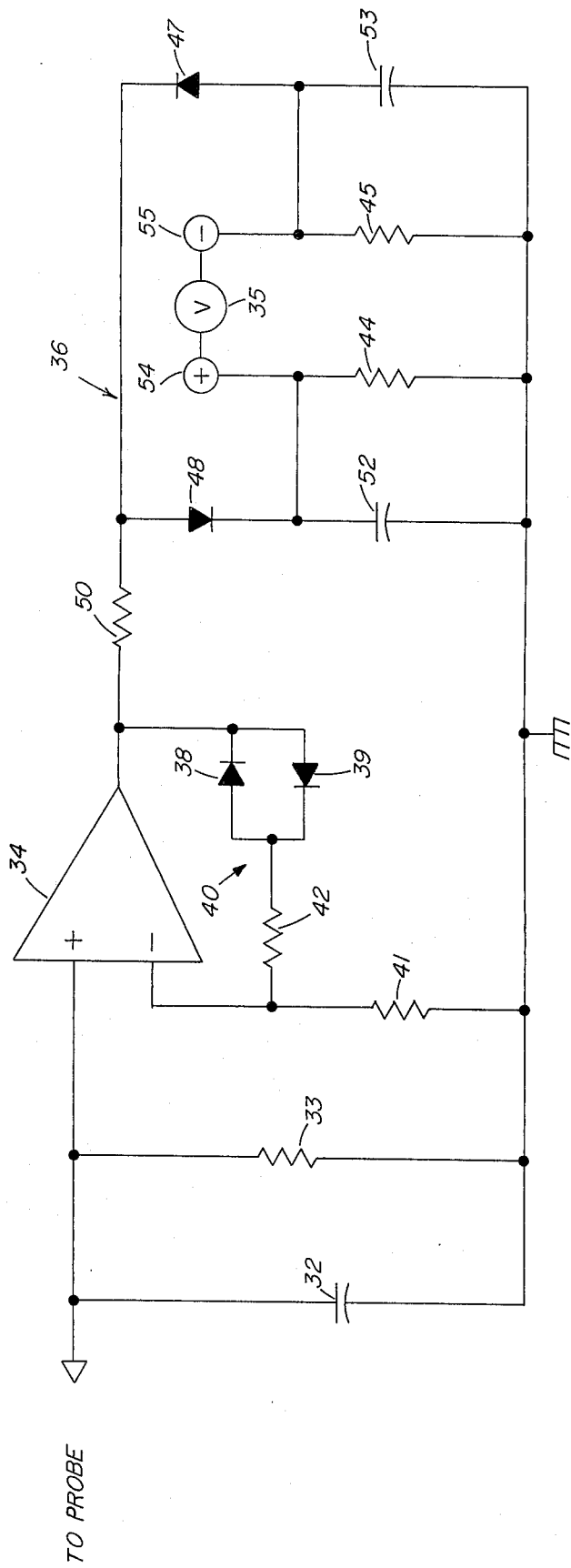
FIG. 3 is a schematic diagram of a circuit used in connection with the apparatus of FIG. 2.

As shown in FIG. 2, the two opposed probes of each probe pair extend parallel to the longitudinal axis of the roller 14 from opposite ends of the roller to a point just short of the roller center. Leads 22 connect the three probes extending from each end of the roller 14 with a strip 20 of electrically conducting material formed in the shape of a circle and positioned in each end surface of the roller 14 concentrically about the longitudinal axis of the roller. Only the strip 20 at the right-hand end of the roller 14 is shown in FIG. 2. As the roller rotates, each conducting strip 20 contacts a silver contact 24 which transmits the voltages sensed by the three probes 16a, 16c and 16e or 16b, 16d and 16f, through a conductor 26, isolated by an insulator 27, to a circuit illustrated in FIG. 2 and described in detail in a later portion of the specification.

The drive for the roller 14 is provided by two insulated rings 28 secured around the circumference of the roller 14 so as frictionally contact the opposite edges of the photoconductive film 12. Thus as the photoconductive film 12 moves in the direction of arrow A around the roller 18, drive is transmitted to the rings 28 which in turn drive the roller 14 in the direction of arrow B. The rings 28 also maintain a fixed distance between the probes 16 and the photoconductive film 102 which is supported on its backside by the transport roller 18.

Surrounding the roller 14 is an electrically grounded shell 30 slit along its length so as to expose only one probe pair at a time to the charged photoconductive film 102.

The circuit shown in FIG. 2 includes a sampling capacitor 32 coupled in parallel with a load resistor 33. The output of the capacitor 32 is fed to the positive input terminal of a FET operational amplifier 34. The output of the amplifier 34 is fed back to the negative input terminal of the amplifier through a feedback loop 40 comprising diodes 38 and 39 and resistor 42 and, through a series output resistor 50 to a peak to peak detector 36 comprising diodes 47 and 48, capacitors 52 and 53 and resistors 44 and 45. It is to be noted that one circuit is provided for the three probes 16a, 16c and 16e at one end of the roller and a second circuit is provided for the probes 16b, 16d and 16f at the opposite end of the roller. Since the two circuits are identical, the operation of the apparatus 10 will be described hereinbelow with regard to the circuit connected to probes 16a, 16c and 16e, it being understood that the circuit connected to the probe 16b, 16d and 16f operates in the same manner.

When the roller 14 rotates, the probes 16a, 16c and 16e are exposed to the charged photoconductive film 102, which in FIG. 4A is illustratively shown as being charged to a negative voltage of 500 volts in increments of 100 volts. When the probes 16a, 16b and 16e are exposed to the charged photoconductive film 102, they charge the sampling capacitor 32 to a potential given by the equation $$V_p = V_c = V_s \left[ \frac{\frac{1}{C\text{ capacitor}}}{\frac{1}{C\text{ probe}} + \frac{1}{C\text{ capacitor}}} \right]$$

Where
$V_p$ = probe voltage
$V_c$ = capacitor voltage
$V_s$ = the voltage on the surface of the photoconductive film
$C$ = capacitance However, when one of the probes is exposed to the film 102, the remaining two probes are exposed to the grounded shell 30. The effect of the two probes exposed to the grounded shell 30 is to parallel the sampling capacitor 32. The probes have a finite capacitance, however, it is typically much smaller than the capacitance of the sampling capacitor 32, so that its effect can be readily compensated for in the calibration of the apparatus 10.

As the probes 16a, 16c and 16e are alternately exposed to the charged photoconductive film 102 and the grounded shell 30, a D.C. voltage in addition to the A.C. voltage is built up on the capacitor 32. If the magnitude of the surface potential ($V_s$) of the element being measured is reduced, a finite amount of time must be allotted for this D.C. voltage on the capacitor 32 to decrease to the point where the incoming A.C. voltage is again bipolar. To provide accurate circuit performance, it is necessary, therefore, to select values for the sampling capacitor 32 and the load resistor 33 that allow the incoming signal to quickly reach equilibrium.

The output of the amplifier 34 is fed to the peak to peak detector 36 through a series resistor 50. The resistor 50 limits the current to the peak to peak detector and provides a closer match between the charging and discharging constant of the peak to peak detector capacitors 52 and 53. The peak to peak detector 36 determines the envelope of the A.C. signal produced by the amplifier 34, the positive portion of the A.C. signal flowing through diode 48 and capacitor 52 and the negative portion of the A.C. signal flowing through diode 47 and capacitor 53. The diodes 38 and 39 in the amplifier feedback loop 40 compensate for the forward drop of the diodes 47 and 48 in the peak to peak detector 36. Ideally, the current in the feedback loop 40 should equal the current in both branches of the peak to peak detector 36 so that the diodes 38 and 39 and the diodes 47 and 48 operate at the same point. Advantageously, the diodes 38 and 39 in the feedback loop 40 are matched with the diodes 47 and 48 in the peak to peak detector 36 so that the apparatus 10 is insensitive to temperature variations. The differential D.C. voltage appearing across the outputs 54 and 55 of the peak to peak detector 36 is representative of the voltage on the charged photoconductive film 12. A graph of this differential D.C. voltage output is shown in FIG. 4C. By comparing the graphs of FIGS. 4A and 4C, it can be seen that the output of the peak to peak detector 36 closely tracks the voltage applied to the photoconductive film 102. A readout measurment of this D.C. differential voltage, if desired, can be obtained by connecting an electrometer means 35, for example, a conventional multimeter across the outputs 54 and 55.

The differential D.C. differential voltage appearing across the outputs 54 and 55 of the peak to peak detector 36 may be utilized as a control signal in the above-described electrophotographic copying machine to control the magnitude of the uniform electrostatic charge deposited on the photoconductive coating 106 at the charging station 110, the brightness of the light image projected onto the charged photoconductive coating 106 at the exposure station 114, the magnitude and plurality of the bias voltage applied by the magnetic brush development unit during development of the latent electrostatic image formed on the recording element 102, the proportion of toner particles introduced into the developer mixture 134 and/or the brightness of the flooding illumination directed onto the photoconductive coating 106 by the erase lamp 160. For example, the voltage can be used to vary the output of voltage source 131 thereby varying the voltage applied to a grid 154 closely spaced between the wires 112 of the corona discharge apparatus and the recording element 102. When this voltage is varied, the magnitude of the change actually deposited on the photoconductive coating 106 of the recording element 102 is similarly varied, thus providing a limited variation of voltage in the latent electrostatic image subsequently produced during exposure. Alternatively, the voltage can be applied to the voltage source 118 to vary the voltage applied to the filament of the projection bulb 117 thereby varying its brightness. Varying the brightness of the projected image varies the rate of discharge of the photoconductive coating 106 during exposure. Alternatively, the voltage can be utilized to vary the output of the voltage source 132 which varies the polarity and magnitude of the voltage applied to the bias wire 130. By varying the voltage applied to the development brush, the electrical field between the developer mixture 134 and the photoconductive coating 106 of the recording element 102 is varied thereby changing the attraction of the toner particles for the latent image. Alternatively, the voltage can be utilized to control the voltage source 142 which operates the vibrator 140 to feed toner particles into the brush housing 128. By varying the voltage applied to the vibrator 140 the proportion of toner particles to carrier particles can be increased thereby increasing the density of the developed areas of the print or decreased thereby decreasing the density of such developed areas. Alternatively, the voltage can be utilized to vary the output of the voltage source 161 thereby varying the brightness of the flooding illumination produced by the erase lamp 160. Varying the brightness of the erase lamp 160 controls the discharge rate of the photoconductie coating 106 at the level required for thorough cleaning without causing excessive photoconductor fatigue.

From the foregoing, the beneficial effects of the present invention are readily apparent, a novel voltage measurement apparatus has been disclosed which can be permanently installed in an electrophotographic copying machine. Another advantage is that by chopping the probe's output signal to reduce the input impedance required for the amplifier, the circuit remains stable with humidity variations. A further advantage is that rotation of the apparatus is accomplished by friction contact with the edges of the moving, charged surface under measurement so that no separate driving devices are required. Still another advantage is that all signal processing is done in an A.C. mode so that the amplifier is insensitive to drift or offset with time and temperature.

The invention has been described in detail with reference to a preferred embodiment thereof, but it will be understood that variations and modifications can be effected within the spirit and scope of the invention. For example, if a chart recorder were substituted for the multimeter, the time constant could be shortened to allow a more detailed voltage profile along the film length. With the use of a high input impedance meter (i.e. greater than 100 megohms) the apparatus could be designed without auxiliary electronics.

We claim:

1. An electrometer adapted for in situ operation in a copying machine of the type including a recording element which is driven along a predetermined path past a plurality of processing stations including stations which (1) form a latent electrostatic image on the recording element and (2) apply developer particles to the latent image to form a visible image, said electrometer comprising:
    a. probe means having at least one electrically conducting detector arranged in a spaced and noncontacting manner from the recording element;
    b. a capacitor coupled to said detector;
    c. a grounded shell surrounding said probe means, said shell having an aperture therein to expose said detector to the image bearing surface of the recording element;
    d. means positioned in frictional contact with the recording element for rotating one of said grounded shell and said probe member in response to movement of the recording element whereby said detector charges said capacitor upon exposure to the recording element to a voltage level which is a function of the surface voltage of the recording element and discharges said capacitor upon exposure to said grounded shell to produce an a.c. voltage on said capacitor;
    e. circuit means coupled to said capacitor for determining the envelope of said a.c. voltage and for producing a differential d.c. control voltage signal representative of the surface voltage on the recording element; and
    f. means for applying said control signal to at least one processing station of the copying machine.

2. An electrometer for non-contact determination of the amplitude of the voltage of a moving, electrostatically charged surface, said electrometer comprising:
    a. an elongated, grounded roller having a probe means mounted on its outer periphery, said probe means having at least one electrically conducting detector arranged in a spaced and non-contacting manner from the charged surface;
    b. means for rotating said roller;
    c. a capacitor coupled to said probe means;
    d. a grounded shell surrounding said roller and arranged in a spaced and non-contacting manner from both the charged surface and said probe means, said shell having an aperture for exposing said probe means to the moving charged surface, said probe means alternately charging said capacitor upon exposure to the charged surface to a voltage level which is a function of the voltage on the charged surface and discharging said capacitor upon exposure to said grounding member to produce an a.c. voltage on said capacitor; and e. circuit means coupled to said capacitor for determining the envelope of said a.c. voltage and for producing a differential d.c. voltage representative of the voltage on the charged surface.

3. The electrometer according to claim 2 wherein said rotating means comprises at least one electrically insulating ring secured around the outer periphery of said roller in frictional contact with the charged surface, said ring providing a fixed distance between the charged surface and said probe means.

4. Apparatus for determining the amplitude of the voltage of a moving, electrostatically charged surface, comprising:
   a. a grounded roller;
   b. a plurality of probe pairs positioned at equally spaced intervals around the outer periphery of said roller, each of said probe pairs comprising two opposed electrically conducting detecting members extending in a direction parallel to the longitudinal axis of said roller from the opposite ends of said roller to the approximate center of said roller;
   c. means operatively associated with said roller for maintaining said probe pairs at a fixed distance from the charged surface and for rotating said roller in response to movement of the charged surface;
   d. a grounded shell surrounding said roller, said shell having a slit along its length dimensioned so as to expose only one probe pair at a time to the moving charged surface; and
   e. first and second circuit means, said first circuit means being connected to one member of each probe pair and said second circuit means being connected to the opposed member of each probe pair, each of said circuit means comprising a sampling capacitor and a peak-to-peak detector, said detecting members alternately charging said capacitor upon exposure to the charged surface to a voltage level which is a function of the voltage on the charged surface and discharging said capacitor upon exposure to the grounded shell to build an a.c. voltage on said capacitor, said peak-to-peak detector being responsive to the a.c. signal on said capacitor for producing a differential d.c. voltage representative of the voltage on the charged surface.

5. The apparatus according to claim 4 wherein each of said circuit means further comprises an operational amplifier coupled between said sampling capacitor and said peak to peak detector.

6. The apparatus according to claim 4 wherein each of said circuit means further comprises an electrometer means connected to the output of said peak-to-peak detector to provide a measurement representative of the voltage on the charged surface.

* * * * *